United States Patent [19]

Huang

[11] Patent Number: 5,670,019

[45] Date of Patent: Sep. 23, 1997

[54] REMOVAL PROCESS FOR TUNGSTEN ETCHBACK PRECIPITATES

[75] Inventor: Yuan-Chang Huang, Hsin-Chu, Taiwan

[73] Assignee: Taiwan Semiconductor Manufacturing Company Ltd., Hsin-Chu, Taiwan

[21] Appl. No.: 606,831

[22] Filed: Feb. 26, 1996

[51] Int. Cl.[6] .................. H01L 21/00; B44C 1/22; C23F 1/00
[52] U.S. Cl. .................. 156/643.1; 156/656.1; 216/18; 216/67; 216/38; 437/228 PL
[58] Field of Search ............... 156/636.1, 643.1, 156/656.1, 657.1; 216/18, 38, 67; 437/228 PL, 228 W; 134/1.2, 1.3

[56] References Cited

U.S. PATENT DOCUMENTS

| | | | |
|---|---|---|---|
| 4,689,113 | 8/1987 | Balasubramanyam et al. | 437/228 X |
| 4,992,135 | 2/1991 | Doan | 216/38 |
| 5,604,158 | 2/1997 | Cadien et al. | 156/636.1 |

OTHER PUBLICATIONS

S. Wolf, "Silicon Processing for the VLSI Era–vol. 1", Lattice Press, Sunset Beach, Ca, 1986, pp. 516–519.

*Primary Examiner*—William Powell
*Attorney, Agent, or Firm*—George O. Saile; Larry J. Prescott

[57] ABSTRACT

This invention provides a method of cleaning integrated circuit wafers which effectively removes precipitates formed as a result of the tungsten etchback process. When tungsten is used to fill via holes in an inter-metal dielectric layer an adhesion layer of titanium nitride, TiN, is required to provide good adhesion. As a result of the tungsten etchback, wherein fluorine based etchants are used, precipitates of $TiF_3$ can form which are extremely difficult to remove. Methods, such as in-situ bake after the tungsten etchback, are used to prevent the formation of the precipitates but do not remove them after they are formed. This invention teaches a method using a strong oxidizing agent, such as $H_2O_2$, to cause an oxidation-reduction reaction which converts the precipitates to a water soluble form. The water soluble form of the precipitates are then removed using a water rinse and spin dry process.

20 Claims, 3 Drawing Sheets

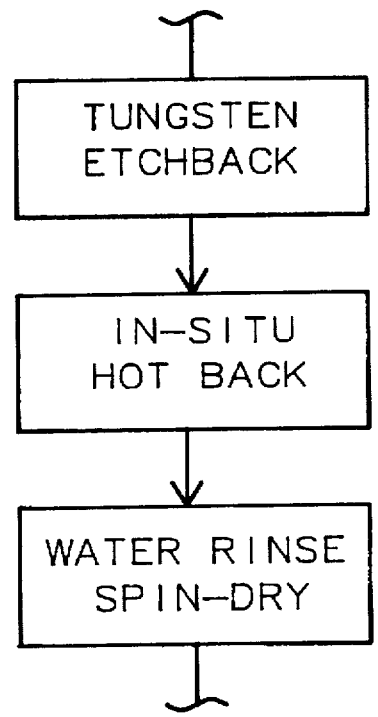
FIG. 3 - Prior Art
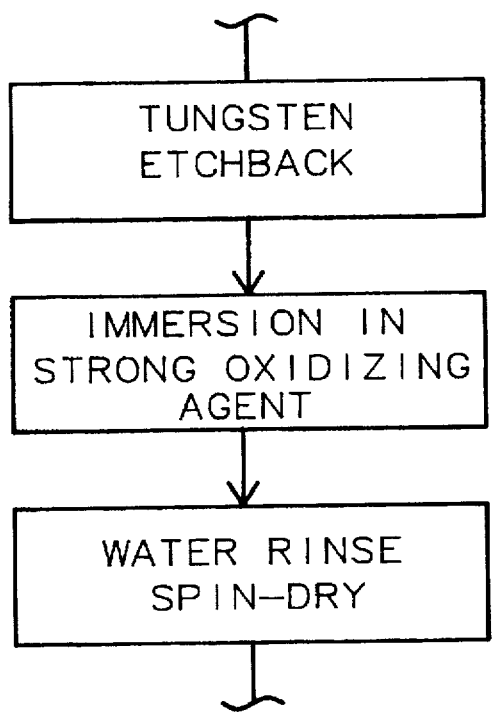
FIG. 4

REMOVAL PROCESS FOR TUNGSTEN ETCHBACK PRECIPITATES

BACKGROUND OF THE INVENTION

(1) Field of the Invention

This invention deals with methods of cleaning integrated circuit wafers and more particularly with methods of removing precipitates formed as a result of the tungsten etchback process.

(2) Description of the Related Art

In the manufacture of integrated circuit wafers it is essential that foreign particles and material be removed from the wafer for each processing step. Some processing steps will form foreign particles and material which must be removed. When conductor metals, such as tungsten, are used to fill via holes in an inter-metal dielectric an adhesion layer of TiN is often used along with blanket deposition and etchback of the conductor metal. The etchback process can result in the formation of precipitates which are very difficult to remove. Process steps such as an in-situ bake after the etchback are used to prevent precipitate formation but, once formed, they are very tenacious. This invention teaches the use of a strong oxidizing agent such as $H_2O_2$ to remove the precipitates.

In the book "SILICON PROCESSING FOR THE VLSI ERA, Vol. 1, by S. Wolf and R. N. Tauber, Lattice Press, Sunset Beach, Calif., 1986, pages 516–519 integrated circuit wafer cleaning is discussed. The discussion indicates that $H_2O_2$ is commonly used for wafer cleaning, however neither the use of $H_2O_2$ for removing tungsten precipitates nor the process taught by this invention is disclosed.

SUMMARY OF THE INVENTION

In the manufacture of semiconductor integrated circuit wafers maintaining wafer cleanliness is of critical importance. Often the metals used to fill via holes in the inter-metal dielectric separating two electrode layers present difficult problems in maintaining wafer cleanliness.

In order to fill via holes in the inter-metal dielectric separating two electrode layers an adhesion layer of a material such as titanium or titanium nitride is deposited over the inter-metal dielectric, on the sidewalls of the via holes, and at the bottom of the via holes. A conduction metal, such as tungsten, is then deposited over the adhesion layer thereby filling the via holes. The tungsten in then back etched using dry etching with a fluorine based etchant such as $SF_6$, $NF_3$, or a combination of $SF_6$ and $NF_3$. After the tungsten etchback precipitates of $TiF_3$ are often formed which can be very difficult to remove.

A process flow diagram for a conventional method of dealing with precipitate formation is shown in FIG. 3. An in-situ hot bake following the tungsten etchback is used to try to avoid the formation of the $TiF_3$ precipitates, and is sometimes effective. However, if these precipitates of $TiF_3$ form they are very tenacious and difficult to remove and seriously impact subsequent process steps, such as forming hillocks or voids in conduction metal layers or dielectric layers.

It is an object of this invention to provide a method for removing precipitates containing titanium and fluorine, formed after metal etchback, from the integrated circuit wafer.

This objective in achieved by immersing the wafer in a strong oxidizing agent after the metal etchback. An oxidation-reduction reaction then converts the precipitates, $TiF_3$, to $Ti(OH)F_3$ which is water soluble. A water-rinse followed by a spin dry removes the precipitates form the wafer.

BRIEF DESCRIPTION OF THE DRAWINGS

FIG. 3 shows the process flow diagram for the conventional method of preventing precipitate formation on the wafer.

FIG. 4 shows the process flow diagram for the method of this invention for removing precipitates formed on the wafer.

DESCRIPTION OF THE PREFERRED EMBODIMENTS

Figure 1:
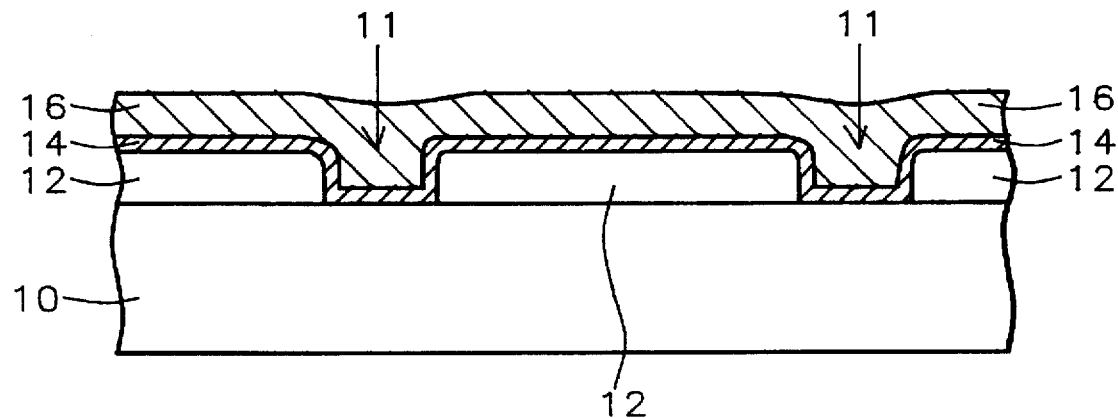
FIG. 1 shows a cross section view of an integrated circuit wafer after formation of via holes in an inter-metal dielectric, formation of a TiN adhesion layer, and formation of a conduction metal layer.

Refer now to FIGS. 1, 2, 4, and 5, there is shown the wafer cleaning method of this invention. FIG. 1 shows a cross section view of an integrated circuit wafer 10, such as silicon, having devices formed therein, not shown, and an inter-metal dielectric layer 12, such as silicon dioxide, borophosphosilicate glass, or the like, formed thereon. Via holes 11 are formed in the inter-metal dielectric layer 12 to provide electrical conduction through the inter-level dielectric layer 12.

An adhesion layer 14 of titanium nitride, TiN, having a thickness of between about 1000 and 2000 Angstroms is formed on the inter-metal dielectric layer, the sidewalls of the via holes 11, and the bottom of the via holes 11. A conducting metal layer 16, such as tungsten, is then formed on the TiN adhesion layer 14 filling the via holes 11. The TiN adhesion layer 14 is required in order to achieve good adhesion of the conducting metal at the sidewalls and bottom of the via holes 11. Without the adhesion layer 14 the adhesion between the conducting metal and the sidewalls and bottom of the via holes would be poor.

Figure 2:
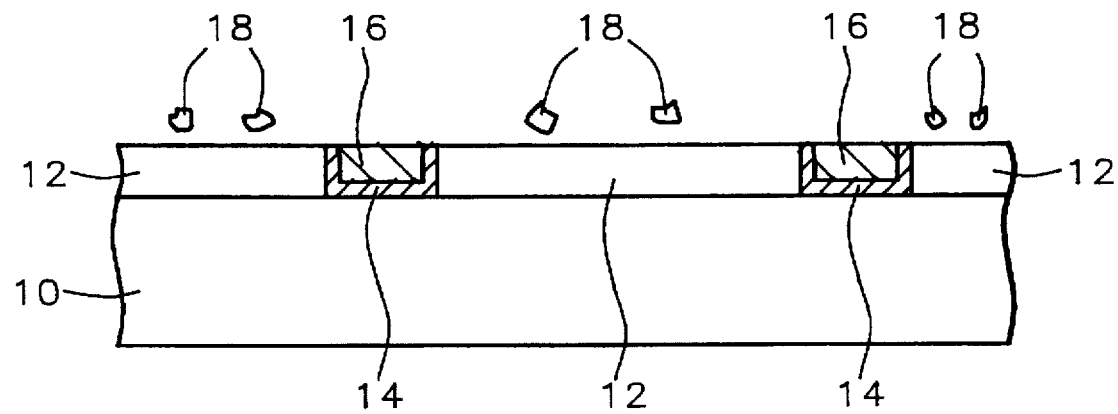
FIG. 2 shows a cross section view of an integrated circuit wafer after etchback of the conduction metal and the TiN adhesion layer showing the formation of precipitates containing $TiF_3$.

A tungsten etchback is then used to remove the tungsten layer and the adhesion layer from the surface of the wafer leaving tungsten and the adhesion layer in the via holes, see FIG. 2. The tungsten etchback uses a dry etch using a fluorine based etchant such as $SF_6$, $NF_3$, or a combination of $SF_6$ and $NF_3$. The combination of the fluorine in the etchant used in the tungsten etchback and the titanium used in the adhesion layer can lead to the formation of $TiF_3$ which can form as precipitates 18 on the surface of the inter-metal dielectric layer 12.

FIG. 3 shows a process flow diagram of a conventional method of attempting to avoid the formation of the precipitates. As shown in FIG. 3, the wafer is given an in-situ hot bake followed by a water rinse and spin dry. This method will be successful much of the time, however will not always be successful. If the precipitates do form they are very tenacious and difficult to remove. These precipitates will cause severe problems with subsequent processing steps.

FIG. 4 shows a process flow diagram of the method of this invention used to remove TiF$_3$ either before or after precipitates have been formed. After the tungsten etchback the wafer is immersed in a strong oxidizing agent, such as a solution of hydrogen peroxide, H$_2$O$_2$, and water having between about 25% and 37% H$_2$O$_2$ by volume for between about 48 and 72 seconds at a temperature of between about 25° C. and 70° C. Following the immersion in the strong oxidizing agent the wafer is immersed in water having a temperature of between about 25° C. and 70° C. for between about 300 and 400 seconds followed by a spin dry.

The oxidizing agent causes an oxidation-reduction reaction wherein the TiF$_3$ is converted to Ti(OH)F$_3$ which is soluble in water and is removed during the subsequent immersion in water. The oxidation-reduction reaction proceeds according to the following equations.

$$H_2O_2 + 2H^+ + 2e^- \rightarrow 2H_2O. \quad \text{(Reduction)}$$

$$TiF_3 + H_2O \rightarrow Ti(OH)F_3 + H^+ + e^-. \quad \text{(Oxidation)}$$

Figure 5:
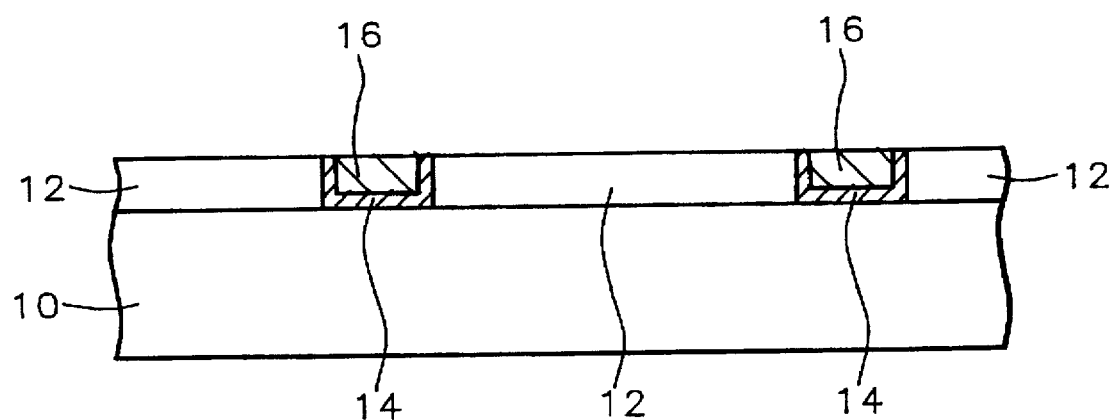
FIG. 5 shows a cross section view of an integrated circuit wafer after etchback of the conduction metal and the TiN adhesion layer using the method of this invention to avoid the formation of precipitates containing $TiF_3$.

During the water immersion the Ti(OH)F$_3$ is dissolved in the water and the water dissolved Ti(OH)F$_3$ is removed during the spin dry step. As shown in FIG. 5, the TiF$_3$ precipitates have been removed from the inter-metal layer surface and the wafer is ready for subsequent processing.

While the invention has been particularly shown and described with reference to the preferred embodiments thereof, it will be understood by those skilled in the art that various changes in form and details may be made without departing from the spirit and scope of the invention.

What is claimed is:

1. A method of cleaning integrated circuit wafers, comprising the steps of:

providing an integrated circuit wafer having devices formed therein and an inter-metal dielectric formed thereon;

providing via holes formed in said inter metal dielectric wherein each said via hole has sidewalls and a bottom;

forming a titanium nitride adhesion layer over said inter-metal dielectric layer, said sidewalls of each said via hole, and said bottom of each said via hole;

forming a conduction metal layer over said titanium nitride adhesion layer thereby filling said via holes with said conduction metal;

etching away that part of said conduction metal layer not filling said via holes and that part of said titanium nitride adhesion layer not on said sidewalls and bottom of each said via hole using dry etching with a fluorine based etchant;

immersing said integrated circuit wafer in an oxidizing agent having a first temperature for a first time, after said metal etchback process has been completed;

immersing said integrated circuit wafer in water having a second temperature for a second time after immersing said integrated circuit wafer in said oxidizing agent has been completed; and drying said wafer after said immersing said wafer in said water has been completed.

2. The method of claim 1 wherein said fluorine based etchant comprises sulfur hexafluoride.

3. The method of claim 1 wherein said fluorine based etchant comprises NF$_3$.

4. The method of claim 1 wherein said conduction metal is tungsten.

5. The method of claim 1 wherein said oxidizing agent is a solution of hydrogen peroxide and water.

6. The method of claim 5 wherein the volume of said hydrogen peroxide in said solution of hydrogen peroxide and water is between about 25% and 37%.

7. The method of claim 1 wherein said first time is between about 48 and 72 seconds.

8. The method of claim 1 wherein said first temperature is between about 25° C. and 70° C.

9. The method of claim 1 wherein said second time is between about 300 and 400 seconds.

10. The method of claim 1 wherein said second temperature is between about 25° C. and 70° C.

11. A method of cleaning integrated circuit wafers, comprising the steps of:

providing an integrated circuit wafer having devices formed therein and an inter-metal dielectric formed thereon;

providing via holes formed in said inter metal dielectric wherein each said via hole has sidewalls and a bottom;

forming a titanium adhesion layer over said inter-metal dielectric layer, said sidewalls of each said via hole, and said bottom of each said via hole;

forming a conduction metal layer over said titanium adhesion layer thereby filling said via holes with said conduction metal;

etching away that part of said conduction metal layer not filling said via holes and that part of said titanium adhesion layer not on said sidewalls and bottom of each said via hole using dry etching with a fluorine based etchant;

immersing said integrated circuit wafer in an oxidizing agent having a first temperature for a first time, after said metal etchback process has been completed;

immersing said integrated circuit wafer in water having a second temperature for a second time after immersing said integrated circuit wafer in said oxidizing agent has been completed; and drying said wafer after said immersing said wafer in said water has been completed.

12. The method of claim 11 wherein said fluorine based etchant comprises sulfur hexafluoride.

13. The method of claim 11 wherein said fluorine based etchant comprises NF$_3$.

14. The method of claim 11 wherein said conduction metal is tungsten.

15. The method of claim 11 wherein said oxidizing agent is a solution of hydrogen peroxide and water.

16. The method of claim 15 wherein the volume of said hydrogen peroxide in said solution of hydrogen peroxide and water is between about 25% and 37%.

17. The method of claim 11 wherein said first time is between about 48 and 72 seconds.

18. The method of claim 11 wherein said first temperature is between about 25° C. and 70° C.

19. The method of claim 11 wherein said second time is between about 300 and 400 seconds.

20. The method of claim 11 wherein said second temperature is between about 25° C. and 70° C.

* * * * *

Adverse Decisions In Interference

Patent No. 5,670,019, Yuan-Chang Huang, REMOVAL PROCESS FOR TUNGSTEN ETCHBACK PRECIPITATES, Interference No. 104,203, final judgment adverse to the patentees rendered January 24, 2000, as to claims 1-20.

*(Official Gazette June 13, 2000)*

Adverse Decisions In Interference

Patent No. 5,670,019, Yuan-Chang Huang, REMOVAL RROCESS FOR TUNGSTEN ETCHBACK PRECIPITATES, Interference No. 104,203, final judgment adverse to the patentee rendered January 24, 2000, as to claims 1-20.

*(Official Gazette July 4, 2000)*